United States Patent [19]
Ehara et al.

[11] Patent Number: 5,323,457
[45] Date of Patent: Jun. 21, 1994

[54] CIRCUIT FOR SUPPRESSING WHITE NOISE IN RECEIVED VOICE

[75] Inventors: Tatsuji Ehara; Motoyoshi Komoda, both of Tokyo; Akimasa Matsushita, Saitama, all of Japan

[73] Assignee: NEC Corporation, Tokyo, Japan

[21] Appl. No.: 822,145

[22] Filed: Jan. 17, 1992

[30] Foreign Application Priority Data

Jan. 18, 1991 [JP] Japan .................................. 3-19290
Jan. 31, 1991 [JP] Japan .................................. 3-32138

[51] Int. Cl.$^5$ ............................................. H04M 9/08
[52] U.S. Cl. .................................... 379/388; 379/390; 379/416; 375/99
[58] Field of Search ............... 379/388, 389, 390, 416; 375/99, 103, 104; 381/94

[56] References Cited

U.S. PATENT DOCUMENTS

| | | | |
|---|---|---|---|
| 3,644,674 | 2/1972 | Mitchell et al. | 379/390 |
| 3,963,868 | 6/1976 | Randmere et al. | 379/390 |
| 4,506,381 | 3/1985 | Ono | 381/94 |
| 4,627,102 | 12/1986 | Nott | 381/94 |
| 4,703,507 | 10/1987 | Holden | 381/94 |
| 4,809,337 | 2/1989 | Scholz et al. | 381/94 |
| 4,847,897 | 7/1989 | Means | 381/94 |
| 4,954,787 | 9/1990 | Brisson | 381/94 |
| 5,058,153 | 10/1991 | Carew et al. | 379/390 |
| 5,161,185 | 11/1992 | Hochschild | 375/99 |

FOREIGN PATENT DOCUMENTS

| | | | |
|---|---|---|---|
| 2907361 | 8/1980 | Fed. Rep. of Germany | 379/416 |
| 2610774 | 8/1988 | France . | |
| 57-72409 | 5/1982 | Japan . | |
| 0007252 | 1/1987 | Japan | 379/416 |
| 1-20767 | 1/1989 | Japan . | |

Primary Examiner—James L. Dwyer
Assistant Examiner—M. Shehata
Attorney, Agent, or Firm—Foley & Lardner

[57] ABSTRACT

A white noise suppressing circuit for suppressing white noise contained in a received voice of a speaker telephone apparatus includes a filter for suppressing white noise contained in an aural input signal input to an aural signal line, a switch for short-circuiting the filter, a detecting circuit for detecting the aural input signal, and a comparator for comparing an output of the detecting circuit with a preset voltage and for controlling the switch on the basis of the results of the comparison. When it is determined by the comparator that there is a voice input, the switch is short-circuited to make the filter inoperable. When there is no voice input, the switch is opened so as to make the filter operate.

4 Claims, 6 Drawing Sheets

CIRCUIT FOR SUPPRESSING WHITE NOISE IN RECEIVED VOICE

BACKGROUND OF THE INVENTION

1. Field of the Invention

The present invention relates to white noise suppressing circuit for suppressing white noise of a voice received by a speaker telephone apparatus.

2. Description of the Related Art

When receiving signals arriving via a communication line are passed through a speaker telephone apparatus, noise caused by the circuit elements in the speaker unit is added to the signal. Such noise is amplified by the speaker amplifier and is noticed as a hiss when there is no receiving signal. The receiving signal has the frequency spectrum shown in FIG. 1, and is transmitted over a bandwidth ranging between 0.3 KHz and 3.4 KHz. However, the noise generated in the speaker unit is homogeneous in terms of frequency and is therefore close to white noise.

When there is a voice input, the voice level is far higher than that of white noise and white noise can thus be ignored. However, when there is no voice input, only white noise is amplified by the speaker amplifier and is output. It is therefore heard as undesired noise. Such a problem involving white noise has conventionally been overcome by the use of a circuit which employs a low-pass filter. That is, a receiving signal line is constructed of, for example, a receiving voice input terminal 1, a receiving amplifier 2, a hand-free (HF) circuit 3, a low-pass filter 4, a speaker amplifier 5 and a receiving voice output terminal 6, as shown in FIG. 2, so that all the frequencies above a certain cutoff point are attenuated by the low-pass filter 4. Alternatively, a switch 11 is provided in the speaker amplifier 5, as shown in FIG. 3. When there is no voice input, the switch 11 is turned off to stop the operation of the speaker amplifier 5.

However, when the voice is passed through the structure shown in FIG. 2 in which the high frequency components of the voice are attenuated by the low-pass filter 4 inserted in the receiving signal line, it is muffled and conversations or the like are thus made obscure. In that case, adjustment of the cutoff frequency of the low-pass filter 4 does not work, because increasing clearness of the voice is incompatible with suppression of white noise. Also, in the structure shown in FIG. 3 in which the speaker amplifier 5 is turned off when there is no voice input, the difference in the sound level between when there is a voice input and when there is no voice input is great, and the user may have an unnatural feeling.

SUMMARY OF THE INVENTION

A primary object of the present invention is to provide a white noise suppressing circuit for suppressing white noise without impairing clearness of voices and without creating an unnatural feeling.

A secondary object of the present invention is to provide a white noise suppressing circuit for suppressing white noise even when the noise level generated at the transmission side is higher than the input voice level.

To achieve the aforementioned primary object, the present invention provides a white noise suppressing circuit which comprises a filter for suppressing white noise contained in a receiving signal, a switch capable of short-circuiting the filter, a detecting circuit for detecting the receiving signal, and a comparator for comparing the detection output with a preset voltage and for controlling the switch on the basis of the results of the comparison. When the comparator detects a voice input, the switch is opened. When there is no voice input, the switch is short-circuited.

In a preferred form, the filter comprises a low-pass filter interposed between a hand-free circuit and a speaker amplifier.

In the present invention, when there is a received voice input, the filter is bypassed so as to output the voice without change and thereby prevent degradation of the clearness of the voice. When there is no received voice, the filter is operated to suppress white noise.

To achieve the secondary object, the present invention provides a white noise suppressing circuit which comprises a detection means for detecting a receiving signal, a charge time constant means for inputting an output signal of the detection means, the charge time constant means having two different time constants, a discharge time constant means for inputting the output signal of the detection means, the discharge time constant means having two different time constants, and a comparison means for inputting to one of input terminals thereof an output signal of the charge time constant means having the larger time constant and of the discharge time constant means having the smaller time constant and to the other input terminal an output signal of the charge time constant means having the smaller time constant and of the discharge time constant means having the larger time constant, for comparing the levels of these two output signals and for producing a control signal on the basis of the results of the comparison.

The detection means detects the receiving signal, and an output signal of the detection means is input to the charge time constant means having two different time constants and to the discharge time constant means having the two different time constants. The comparison means receives to one of input terminals thereof an output signal of the charge time constant means having the larger time constant and of the discharge time constant means having the smaller time constant and to the other input terminal an output signal of the charge time constant means having the smaller time constant and of the discharge time constant means having the larger time constant, and compares the levels of these two output signals. When the output signal of the charge time constant means having the smaller time constant and of the discharge time constant means having the larger time constant is higher, the control signal is supplied to the switch to bypass the low-pass filter. That is, a reference value which determines presence or absence of a voice input is switched from an absolute value to a relative value, and that relative value is compared with a value determined by a changing amplitude and a frequency of an aural signal to perform control of the switch. Consequently, white noise when there is no voice input as well as noise generated at the transmission side can be detected without degrading the clearness of the voice.

DETAILED DESCRIPTION OF THE PREFERRED EMBODIMENTS

Figure 1:
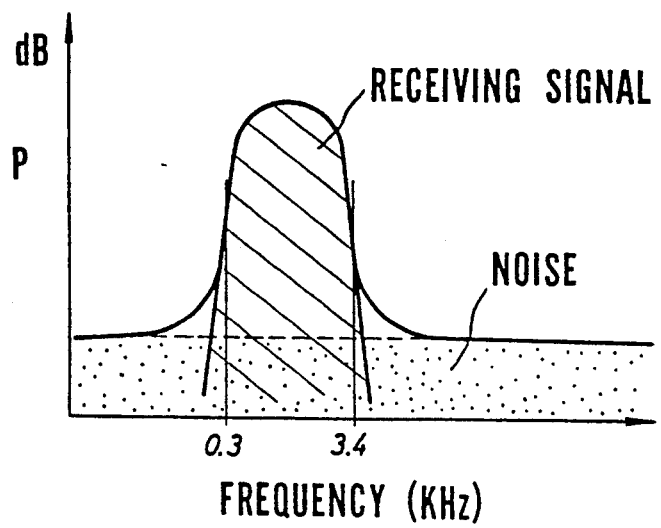
FIG. 1 shows the frequency spectrum of a receiving signal.
Figure 2:
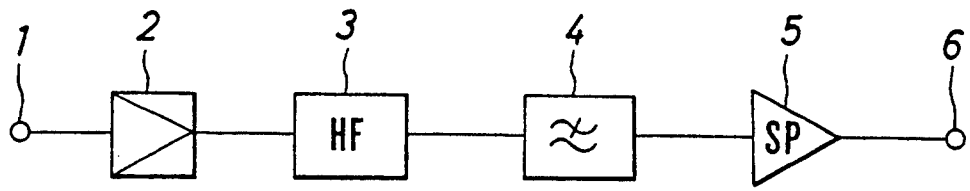
FIGS. 2 and 3 are diagrammatic views of two different speaker telephone apparatuses in which a conventional white noise suppressing circuit is incorporated.
Figure 3:
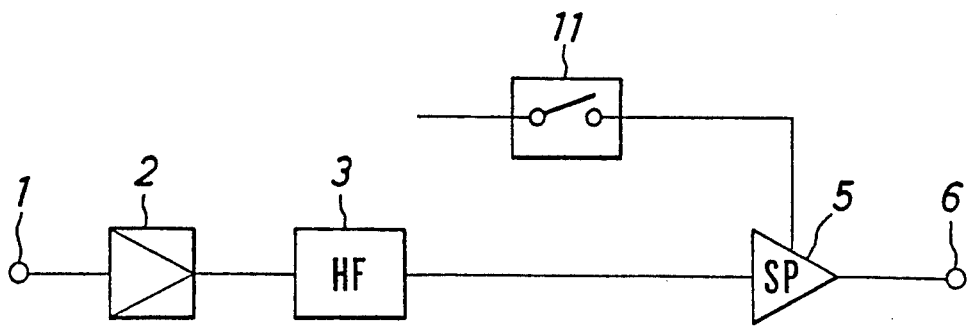
Figure 4:
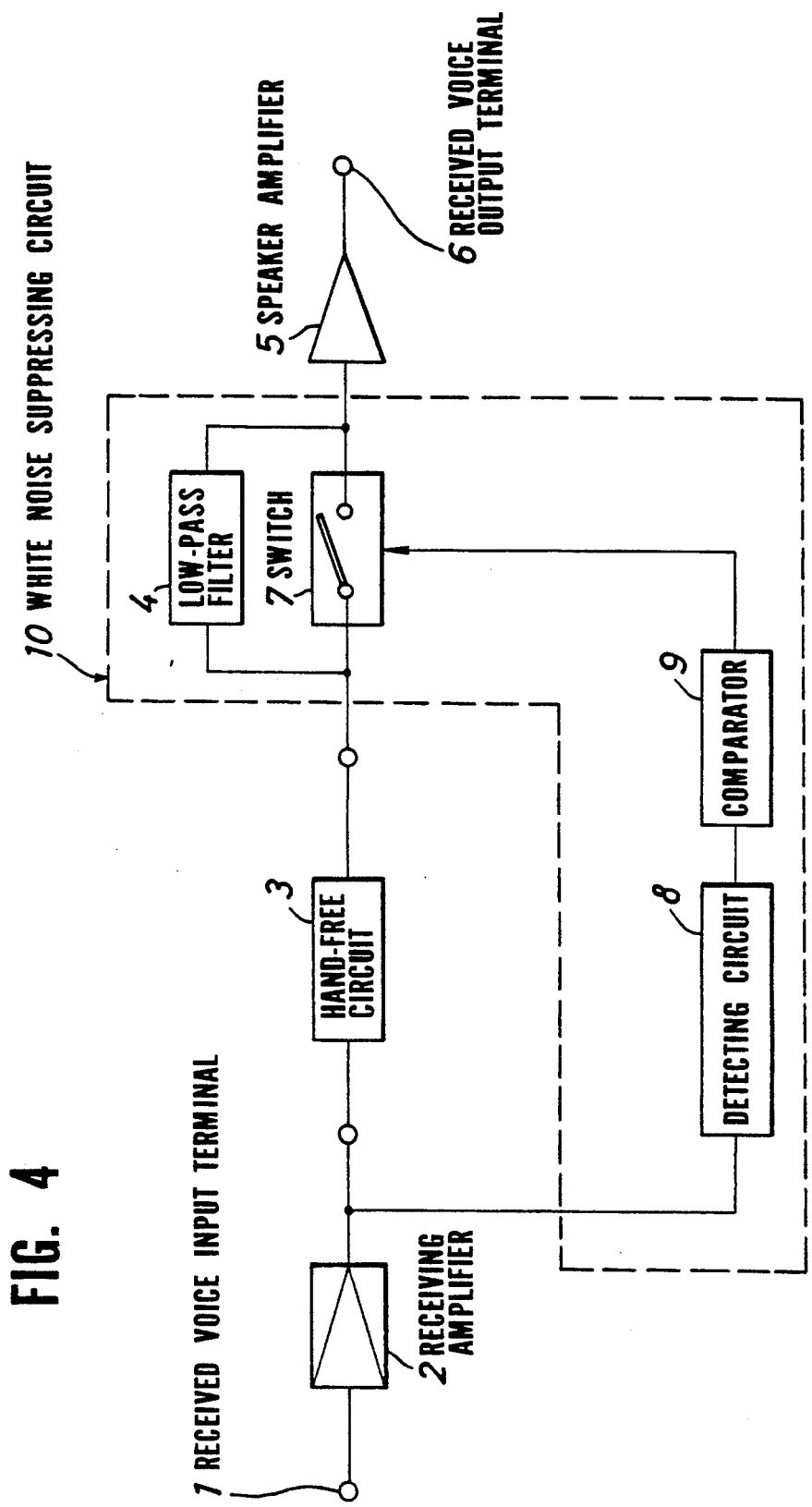
FIG. 4 is a diagrammatic view of a speaker telephone apparatus in which a first embodiment of a white noise suppressing circuit according to the present invention is incorporated.

A first embodiment of the present invention will now be described in detail with reference to FIGS. 4 and 5. Referring first to FIG. 4 in which the same reference numerals are used to denote parts which are identical to those shown in FIGS. 2 and 3, reference numerals 1, 2, 3, 5 and 6 respectively denote the received voice input terminal, the receiving amplifier, the hand-free circuit, the speaker amplifier and the received voice output terminal. A white noise suppressing circuit 10 is interposed between the hand-free circuit 3 and the speaker amplifier 5. The white noise suppressing circuit 10 includes the low-pass filter interposed between the hand-free circuit 3 and the speaker amplifier 5, a switch 7 for short-circuiting the low-pass filter 4, a detecting circuit 8 for detecting a voice signal which is input to the hand-free circuit 3 from the receiving amplifier 2, and a comparator 9 for turning on the switch 7 when the output of the detecting circuit 8 exceeds a predetermined level.

The output of the receiving amplifier 2 is detected by the detecting circuit 8. When the output of the detecting circuit 8 exceeds the predetermined level, the switch 7 is turned on by the comparator 9 to bypass the low-pass filter 4. Consequently, the aural signal input to the received voice input terminal 1 passes through the hand-free circuit 3 and then the speaker amplifier 5 and is output without change.

When there is no aural signal input to the received voice input terminal 1 (in a wait state), the output level of the detecting circuit 8 is lower than the predetermined level, and control of the switch 7 is not performed and the switch 7 remains off. Consequently, the aural signal input to the received voice input terminal 1, that is, white noise because there is no voice input, passes through the hand-free circuit 3, the low-pass filter 4 and then the speaker amplifier 5 and is output.

More specifically, the low-pass filter 4 functions and thereby removes white noise only when there is no voice input. When there is a voice input, the low-pass filter 4 is bypassed. As a result, attenuation of the high-frequency components of the voice and, hence, degradation of the clearness of the voice, is prevented. Furthermore, since turning on or off of the speaker amplifier 5 is not performed in the above-mentioned structure, an unnatural feeling is not created.

Figure 5:
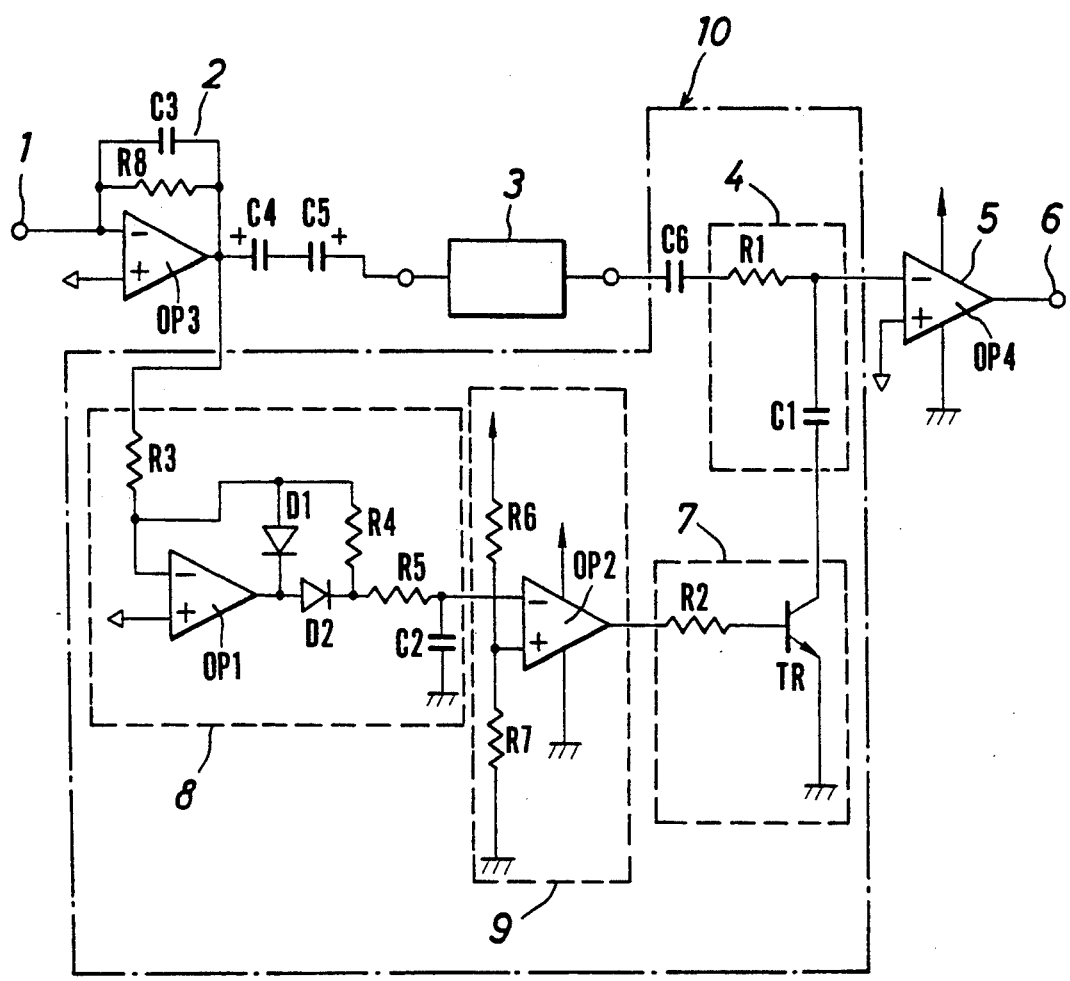
FIG. 5 shows a practically employed circuit of the embodiment shown in FIG. 4.

FIG. 5 shows a practically employed circuit configuration of the circuit shown in FIG. 4, particularly, of the white noise suppressing circuit 10. The low-pass filter 4 is made up of a resistor R1 and a capacitor C1. The switch 7 is constructed by a transistor TR and a resistor R2. When this transistor TR is turned on, the capacitor C1 of the low-pass filter 4 is grounded, making the low-pass filter 4 function. That is, when the transistor TR is turned on, the switch 7 is turned off. The detecting circuit 8 includes an operational amplifier OP1, resistors R3 through R5, a capacitor C2, and diodes D1 and D2. The comparator 9 is made up of an operational amplifier OP2 and resistors R6 and R7.

The receiving amplifier 2 is constructed by an operational amplifier OP3, a resistor R8 and a capacitor C3. The speaker amplifier 5 is constituted by an operational amplifier OP4. Capacitors 4 through 6 are d.c. current cut capacitors.

In the aforementioned structure, the output of the receiving amplifier 2 is detected by the detecting circuit 8. The output of the detecting circuit 8 is input to an inverse input terminal of the operational amplifier OP2 of the comparator 9. The operational amplifier OP2 compares this output of the detecting circuit 8 with the preset voltage divided by the resistors R6 and R7, and outputs a negative signal to turn off the transistor TR of the switch 7 and thereby stop the function of the low-pass filter 7 when the detection output is higher than the preset voltage. Conversely, when the detection output is lower than the preset voltage, the operational amplifier OP 2 outputs a positive signal to turn on the transistor TR and thereby make the low-pass filter 4 function.

In this embodiment, as mentioned above, the switch capable of short-circuiting the filter for suppressing white noise is turned on or off in response to presence or absence of an input aural signal. That is, the aural signal is output without being passed through the filter when there is a voice input, and is output after being passed through the low-pass filter when there is no voice input. It is therefore possible to enhance the clearness of the voice and to suppress the white level when there is no voice input.

In the first embodiment of the white noise suppressing circuit shown in FIGS. 4 and 5, when the noise input level on the transmission side is higher than the voice input level, noise is erroneously regarded as a voice and the noise signal is thus output without being passed through the low-pass filter. Such noise is heard as a harsh sound.

Figure 6:
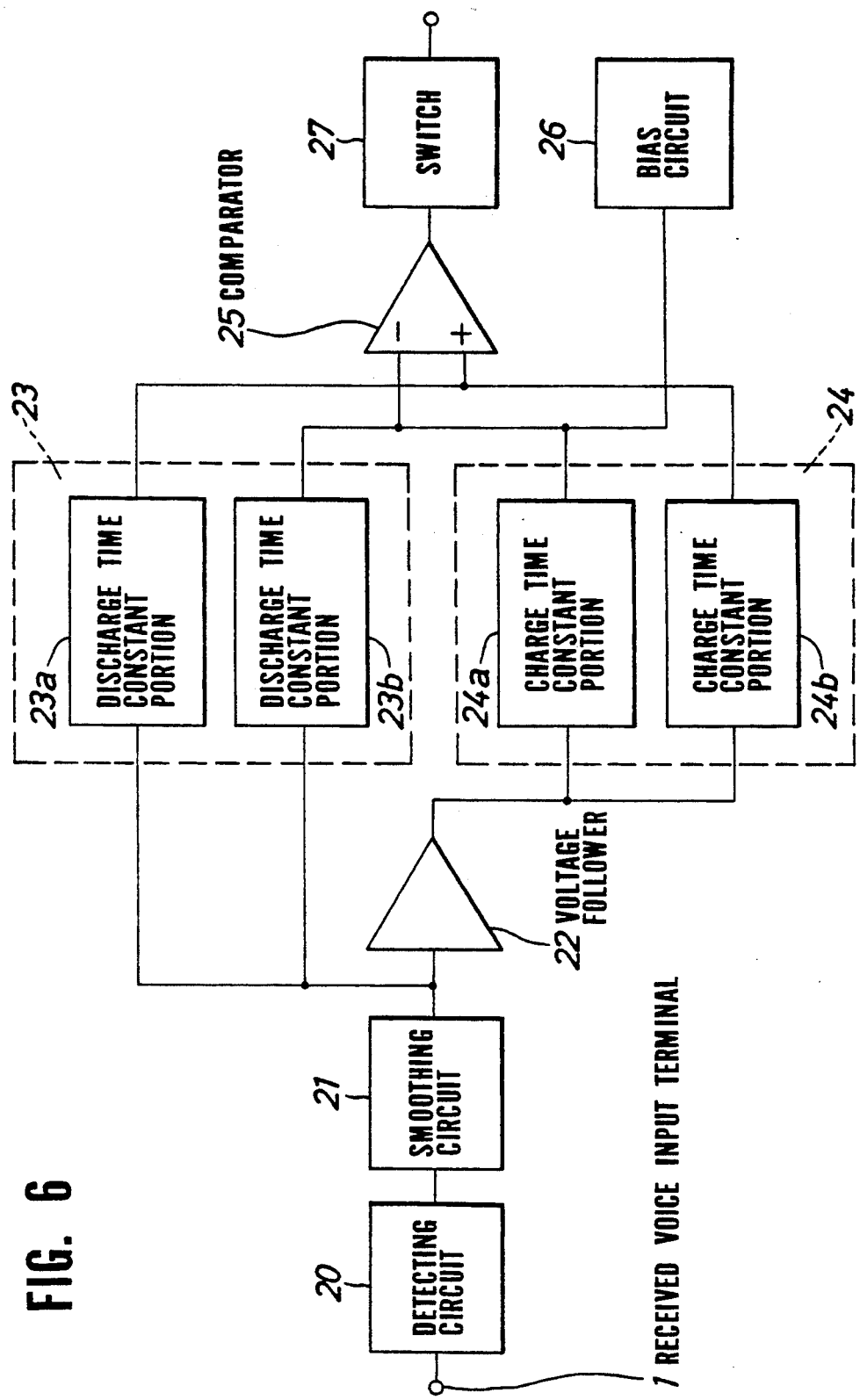
FIG. 6 is a diagrammatic view of a noise detecting circuit used in a second embodiment of the white noise suppressing circuit according to the present invention.
Figure 7:
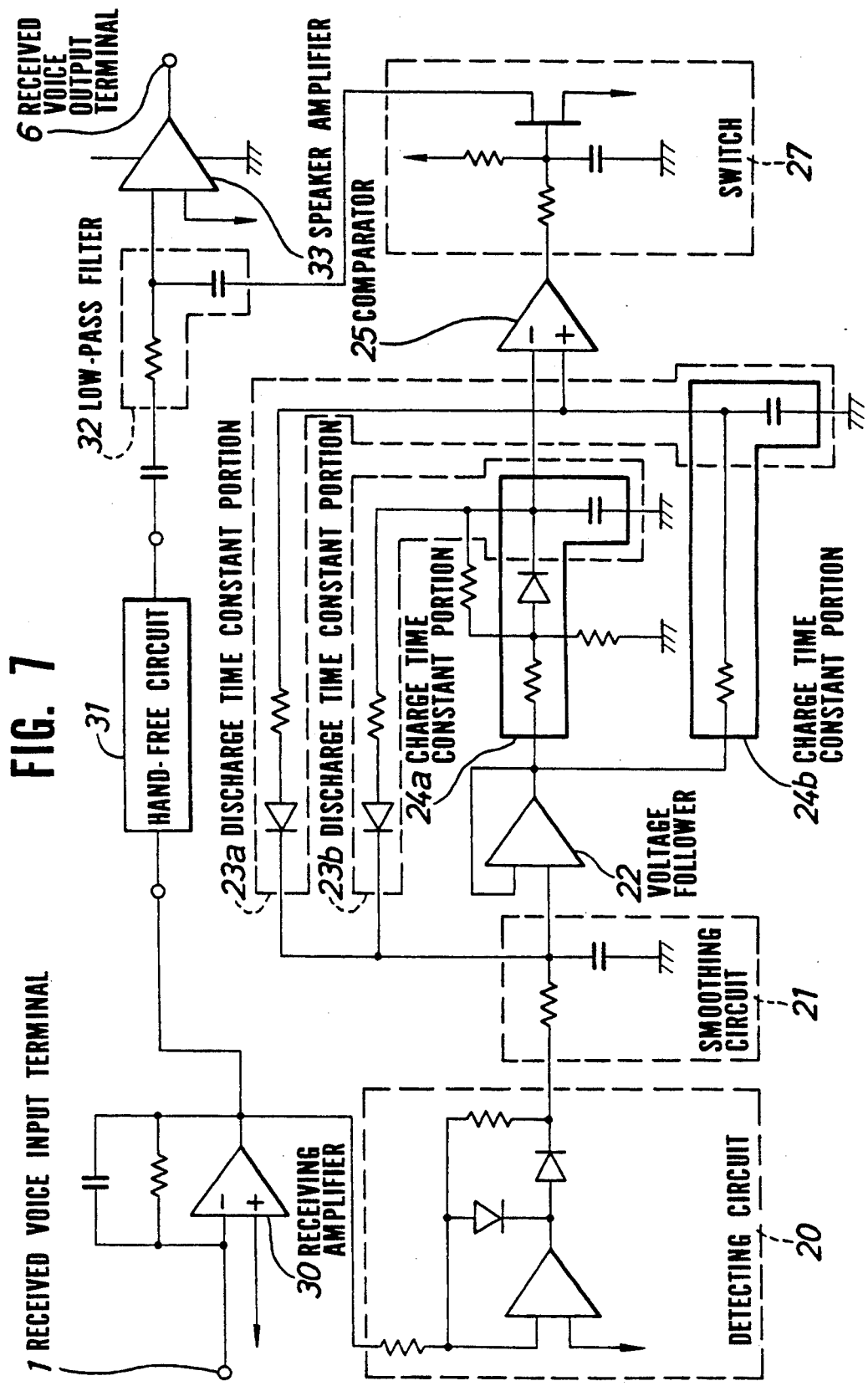
FIG. 7 is a diagrammatic view of a speaker telephone apparatus in which the white noise suppressing circuit employing the noise detecting circuit of FIG. 6 is incorporated.

Hence, another embodiment of the white noise suppressing circuit which can overcome the aforementioned drawback is provided and shown in FIGS. 6 and 7.

FIG. 6 is a circuit diagram of the essential parts of the white noise suppressing circuit, that is, a noise detecting circuit, and FIG. 7 is a circuit diagram of a speaker telephone apparatus in which the white noise suppressing circuit is incorporated.

Referring first to FIG. 6, a detecting circuit 20 and a smoothing circuit 21 serve as a detection means for detecting a receiving signal. A voltage follower 22 and a charge time constant circuit 24 having charge time constant portions 24a and 24b serve as the charge time constant means which receives an output signal of the smoothing circuit 21 and which has two different time constants. A discharge time constant circuit 23 having discharge time constant portions 23a and 23b serves as the discharge time constant means which receives an output signal of the smoothing circuit 21 and which has two different time constants. A comparator 25 and a bias circuit 26 serve as a comparison means which inputs an output signal of the charge time constant portion 24b having the larger time constant and of the discharge time constant portion 23a having the smaller time constant to one (+) of input terminals thereof as well as an output signal of the charge time constant portion 24a having the smaller time constant and of the discharge time constant portion 23b having the larger time constant to the other (−) terminal thereof, which compares the levels of these two output signals and which outputs a control signal on the basis of the results of the comparison.

Now, the operation of the noise detecting circuit shown in FIG. 6 will be explained.

The detecting circuit 20 detects the aural signal input through the received voice input terminal 1, and the smoothing circuit 21 rectifies the output signal of the detecting circuit 21 and outputs a rectified signal to the charge time constant circuit 24. The charge time constant circuit 24 is made up of the charge time constant portions 24a and 24b having different time constants. The aural signal rectified by the smoothing circuit 21 is input to the charge time constant portion 24a having the smaller time constant and to the charge time constant portion 24b having the larger time constant. The aural signal which has been input to the charge time constant portion 24a having the smaller time constant is input to the discharge time constant portion 23b having the larger time constant, while the aural signal which has been input to the charge time constant portion 24b having the larger time constant is input to the discharge time constant portion 23a having the smaller time constant. The aural signal output from the charge time constant portion 24a and the aural signal output from the charge time constant portion 24b are respectively input to the input terminals of the comparator 25 which compares these aural signals input thereto and outputs a control signal to the switch 27.

Figure 8:
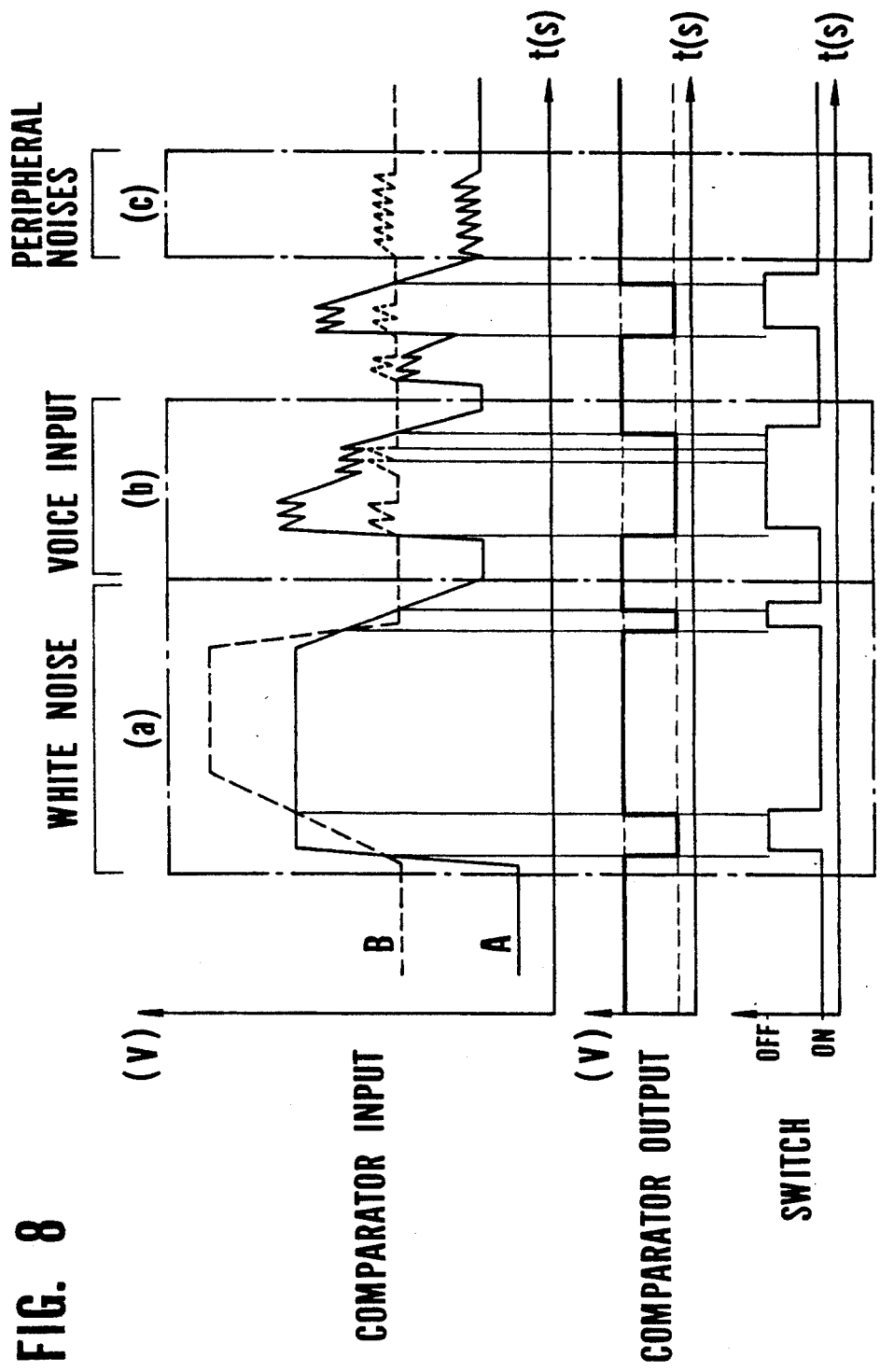
FIG. 8 is a timing chart showing the basic operation for noise detection in the speaker telephone apparatus shown in FIG. 7.

FIG. 8 is a time chart showing the basic operation of the noise detecting circuit. The basic operation of noise detection executed by the circuit shown in FIG. 7 will be explained with reference to the time chart of FIG. 8. In FIG. 7, the same reference numerals are used to denote parts or components which are identical with those shown in FIG. 6.

The aural signal input through the received voice input terminal 1 is amplified by a receiving amplifier 30, and is then sent to a hand-free circuit 31 and to the detecting circuit 20 and the smoothing circuit 21. The aural signal which has passed through the charge time constant portion 24a having the smaller time constant and the discharge time constant portion 23b having the larger time constant is input to a minus input terminal of the comparator 25, and the aural signal which has passed through the charge time constant portion 24b having the larger time constant and the discharge time constant portion 23a having the smaller time constant is input to a plus input terminal of the comparator 25. The aural signal input to the minus input terminal of the comparator 25 is indicated by a solid line A in FIG. 8, and the aural signal input to the plus input terminal of the comparator 25 is indicated by a broken line B in FIG. 8. The comparator 25 compares the aural signals input to the plus and minus input terminals thereof, and thereby controls the switch 27. (a) indicates the aural signal input to the comparator 25, the output signal of the comparator 25 and the operation of the switch 27 when white noise is output from the smoothing circuit 21. (b) indicates the aural signal input to the comparator 25, the output signal of the comparator 25 and the operation of the switch 27 when there is a voice input. (c) indicates the aural signal input to the comparator 25, the output signal of the comparator 25 and the operation of the switch 27 when there is a noise input from the transmission side. When the switch 27 is turned on, the low-pass filter 32 functions and thereby attenuates the high frequency components of white noise or noise from the transmission side. As a result, the aural signal amplified by the speaker amplifier 33 is output from the received voice output terminal 6 as a smooth sound.

In this embodiment, it is therefore possible to detect and suppress not only white noise obtained when there is no voice input but also noise generated on the transmission side without degrading the clearness of the voice.

Having described out invention as related to the embodiments employing the low-pass filter, it is our intention that the invention be not limited by any of the details of description, unless otherwise specified, but rather be constructed broadly within its spirit and scope as set out in the appended claims.

What is claimed is:

1. A white noise suppressing circuit for suppressing white noise in a received voice of a speaker telephone apparatus including a receiving amplifier connected to a received voice input terminal to which an aural signal is input, a speaker amplifier connected to a received voice output terminal, and a hand-free circuit connected in series between said receiving amplifier and said speaker amplifier, said white noise suppressing circuit comprising:

a filter connected in series to said hand-free circuit between said receiving amplifier and said speaker amplifier for suppressing white noise contained in said aural signal;

a detecting circuit for detecting said aural signal;

a comparator for determining the presence or absence of said voice input and outputting a comparison result;

two charge time constant circuits for inputting the output signal of said detecting circuit and having different time constants;

two discharge time constant circuits for inputting the output signal of said detecting circuit and having different time constants, wherein both an output signal of said charge time constant circuit having the larger time constant and an output signal of said discharge time constant circuit having the smaller time constant are supplied to a first input terminal of said comparator, while both an output signal of said charge time constant circuit having the smaller time constant and an output signal of said discharge time constant circuit having the larger time constant are supplied to a second input terminal of said comparator; and a switch connected in parallel to said filter, said switch being respectively closed and opened on the basis of said comparison result.

2. A white noise suppressing circuit for suppressing white noise of a received voice according to claim 1, wherein said filter comprises a low-pass filter connected between said hand-free circuit and said speaker amplifier.

3. A white noise suppressing circuit for suppressing white noise of a received voice according to claim 1, wherein said switch comprises a transistor which is turned on and off by an output of said comparator.

4. A speaker telephone apparatus comprising:
- a receiving amplifier connected to a received voice input terminal to which an aural signal is input;
- a speaker amplifier connected to a received voice output terminal;
- a hand-free circuit connected in series between said receiving amplifier and said speaker amplifier;
- a filter connected in series to said hand-free circuit between said receiving amplifier and said speaker amplifier for suppressing noise contained in said aural signal;
- a detecting circuit for detecting said aural signal;
- a comparator outputting a comparison result indicating presence or absence of a voice signal;
- two charge time constant circuits for inputting the output signal of said detecting circuit and having different time constants;
- two discharge time constant circuits for inputting the output signal of said detecting circuit and having different time constants, wherein both an output signal of said charge time constant circuit having the larger time constant and an output signal of said discharge time constant circuit having the smaller time constant are supplied to a first input terminal of said comparator, while both an output signal of said charge time constant circuit having the smaller time constant and an output signal of said discharge time constant circuit having the larger time constant are supplied to a second input terminal of said comparator; and
- a switch connected in parallel to said filter, said switch being respectively closed and opened according to said comparison result.

* * * * *